United States Patent [19]

Takemae

[11] Patent Number: 4,768,193

[45] Date of Patent: Aug. 30, 1988

[54] SEMICONDUCTOR MEMORY DEVICE HAVING ERROR CORRECTION FUNCTION AND INCORPORATING REDUNDANCY CONFIGURATION

[75] Inventor: Yoshihiro Takemae, Tokyo, Japan

[73] Assignee: Fujitsu Limited, Kawasaki, Japan

[21] Appl. No.: 863,608

[22] Filed: May 15, 1986

[30] Foreign Application Priority Data

May 16, 1985 [JP] Japan ................................ 60-104632

[51] Int. Cl.[4] ........................ G06F 11/10; G06F 11/20
[52] U.S. Cl. ...................................... 371/10; 371/50; 371/51
[58] Field of Search ...................... 371/10, 21, 50, 51, 371/38, 13; 365/200, 201; 364/200 MS File, 900 MS File

[56] References Cited

U.S. PATENT DOCUMENTS

| | | | |
|---|---|---|---|
| 4,394,763 | 7/1983 | Nagano | 371/10 X |
| 4,456,993 | 6/1984 | Taniguchi | 371/10 |
| 4,464,747 | 8/1984 | Groudan | 371/50 |
| 4,584,681 | 4/1986 | Singh | 371/10 |
| 4,656,610 | 4/1987 | Yoshida | 365/200 |
| 4,688,219 | 8/1987 | Takamae | 371/10 |

OTHER PUBLICATIONS

IEEE Journal of Solid-State Circuits, vol. SC-18, No. 5, Oct. 1983, "Circuit Techniques for a VLSI Memory", by Mano et al., pp. 463-470.

Primary Examiner—Jerry Smith
Assistant Examiner—Robert W. Beausoliel
Attorney, Agent, or Firm—Staas & Halsey

[57] ABSTRACT

A semiconductor memory device having a main memory cell array including a plurality of rows of cell arrays, each row corresponds to a two-dimensional virtual matrix configuration. A redundancy memory cell array is provided which includes a plurality of rows of redundancy memory cells, each row corresponding to one horizontal or vertical group of memory cells of the virtual matrix configuration. When a selected memory cell is a predetermined defective cell, a row of memory cells including the defective cell is replaced with the redundancy memory cell array, thereby correcting a hard error. Also, the defective cell is accessed by an error checking and correcting circuit of a horizontal and vertical parity checking type. A horizontal or vertical group of memory cells including the selected memory cell is replaced with the corresponding row of the redundancy memory cell array, thereby correcting a soft error and a hard error other than the predetermined hard error.

4 Claims, 14 Drawing Sheets

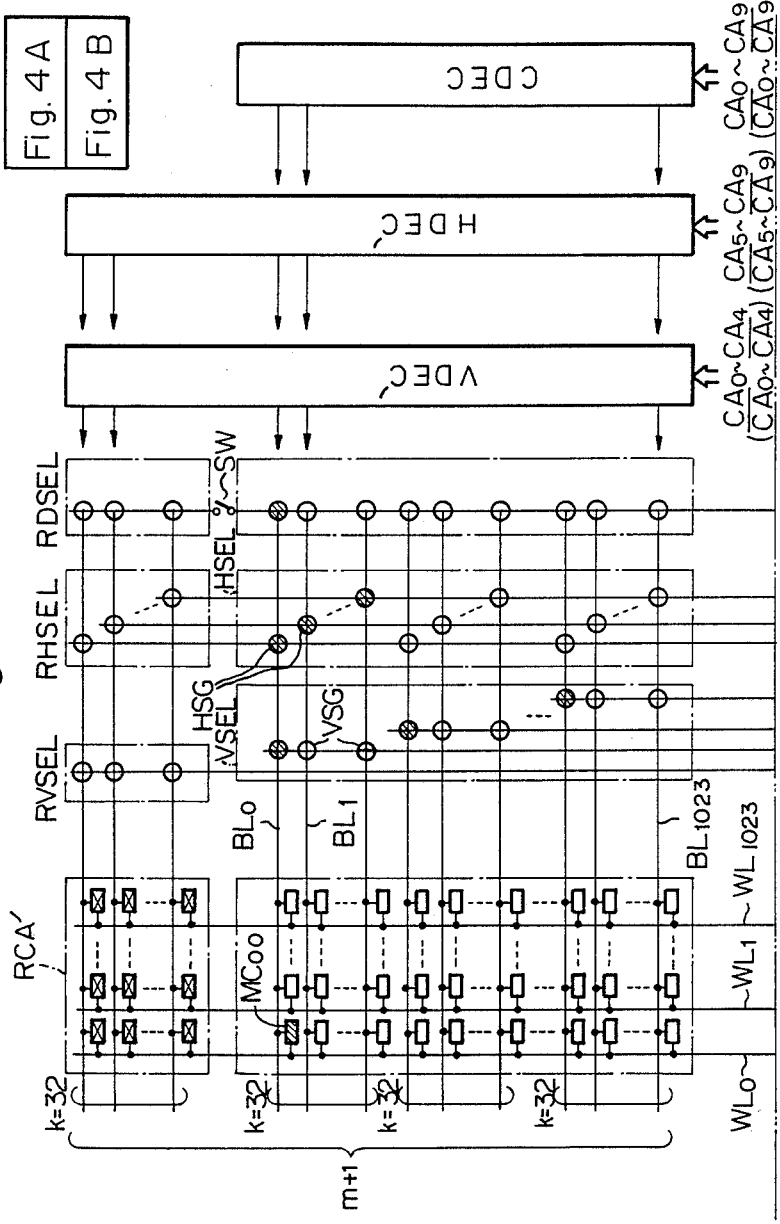

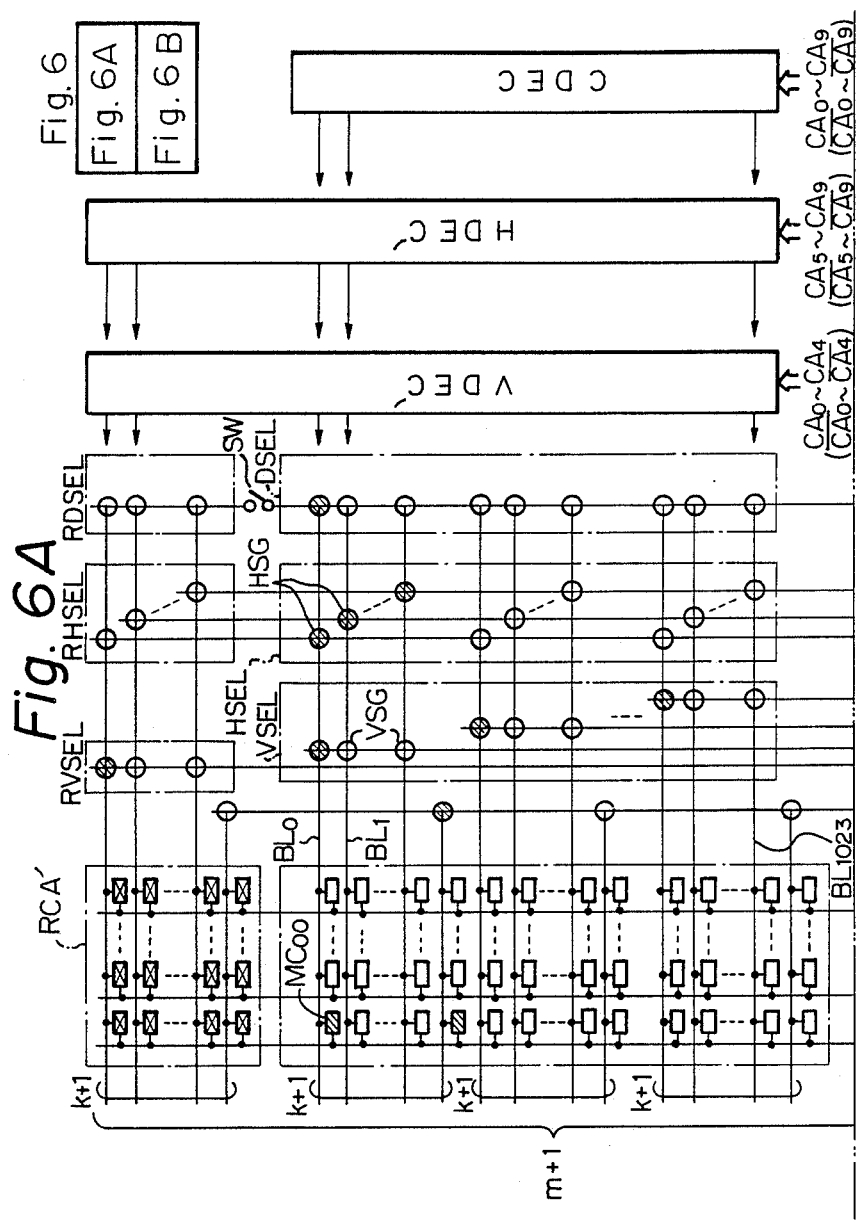

SEMICONDUCTOR MEMORY DEVICE HAVING ERROR CORRECTION FUNCTION AND INCORPORATING REDUNDANCY CONFIGURATION

BACKGROUND OF THE INVENTION (1) Field of the Invention

The present invention is directed to a semiconductor memory device having an error correction function and incorporating a redundancy configuration, thereby correcting both a soft error and a hard error.

(2) Description of the Related Art

A semiconductor memory device includes a large number of memory cells arranged along rows and columns which are orthogonal to each other. A density of defects generated in such a semiconductor memory device during manufacturing is relatively independent of the integration density of the device, but is dependent on semiconductor manufacturing technology. Therefore, the higher the integration density of the device, the greater the ratio of the number of normal memory cells to that of defective memory cells. This is one of the advantages obtained by increasing the integration density of a semiconductor memory device. Nevertheless, if the device includes even only one defective memory cell, which is called a hard error cell, the device cannot operate normally, and therefore, the device is scrapped.

To be able to operate a semiconductor memory device despite a hard error cell, a semiconductor memory device in which a redundancy memory cell array is incorporated with a main memory cell matrix along rows or columns thereof has been developed. In this device, when a hard error cell is detected, the redundancy memory cell array is used instead of a row memory cell array or a column memory cell array including the hard error cell. Accordingly, in a semiconductor memory device including such a redundancy memory cell array, the manufacturing yield thereof can be improved. Note that this redundancy technique can be applied only to previously determined hard errors. That is, once hard error cells are determined, other errors cannot be corrected after the determination of the hard error cells.

On the other hand, as the capacity of a semiconductor memory device is increased to 256 Kbits, 1 Mbits, and 4 Mbits, in order to reduce the size of the memory cells, the generation rate of soft errors due to α-rays has also increased. Such soft errors are corrected by an error checking and correcting (ECC) circuit, not by the above-mentioned redundancy technique. For this purpose, a dynamic random access memory (RAM) incorporating an ECC circuit of a two-dimensional virtual matrix type parity checking (or horizontal and vertical type parity checking) is known (see: T. Mano et al., "Circuit Techniques for a VISI Memory", IEEE Journal of Solid-State Circuits, Vol. SC-18, No. 5, pp. 463–469).

The above-mentioned redundancy technique can be combined with the improved ECC technique to enable the correction of not only the previously determined hard errors but also soft errors or hard errors caused after the determination of the previously determined hard errors. However, since the two-dimensional virtual matrix parity-checking has a predetermined logic for outputting data in response to a selected memory cell, it is impossible to simply replace a defective row or column with the redundancy row or column. Therefore, unless a great number of circuit elements for preventing the previously determined defective hard errors from entering the two-dimensional virtual matrix are used, it is difficult to combine the redundancy technique with the improved ECC technique.

SUMMARY OF THE INVENTION

It is an object of the present invention to combine the redundancy technique with the ECC circuit in a semiconductor memory device without using a large number of circuit elements.

According to the present invention, a semiconductor memory device comprises a main memory cell array including a plurality of rows of cell arrays. Each row corresponds to a two-dimensional virtual matrix configuration. A redundancy memory cell array is also included having a plurality of rows of redundancy memory cells. Each row corresponds to one horizontal or vertical group of memory cells of the virtual matrix configuration. When a selected memory cell is a predetermined defective cell, a row of memory cells, including the defective cell, is replaced with the redundancy memory cell array. In addition, the defective cell is accessed by an error checking and correcting (ECC) circuit of a horizontal and vertical parity checking type, and a horizontal or vertical group including the selected memory cell is replaced with the corresponding row thereof of the redundancy memory cell array. Thus, soft errors and hard errors other than the predetermined hard error also can be corrected.

BRIEF DESCRIPTION OF THE DRAWINGS

The present invention will be more clearly understood from the description as set forth below with reference to the accompanying drawings, wherein:

FIGS. 4A and 4B are a circuit diagram of an embodiment of the semiconductor memory device incorporating an ECC circuit and a redundancy configuration according to the present invention;

FIGS. 6A and 6B are a circuit diagram of another embodiment of the semiconductor memory device incorporating an ECC circuit and a redundancy configuration according to the present invention;

DESCRIPTION OF THE PREFERRED EMBODIMENTS

Before describing the embodiments of the present invention, a prior art semiconductor memory device incorporating an ECC circuit will be explained with reference to FIGS. 1 and 2.

Figure 1A:
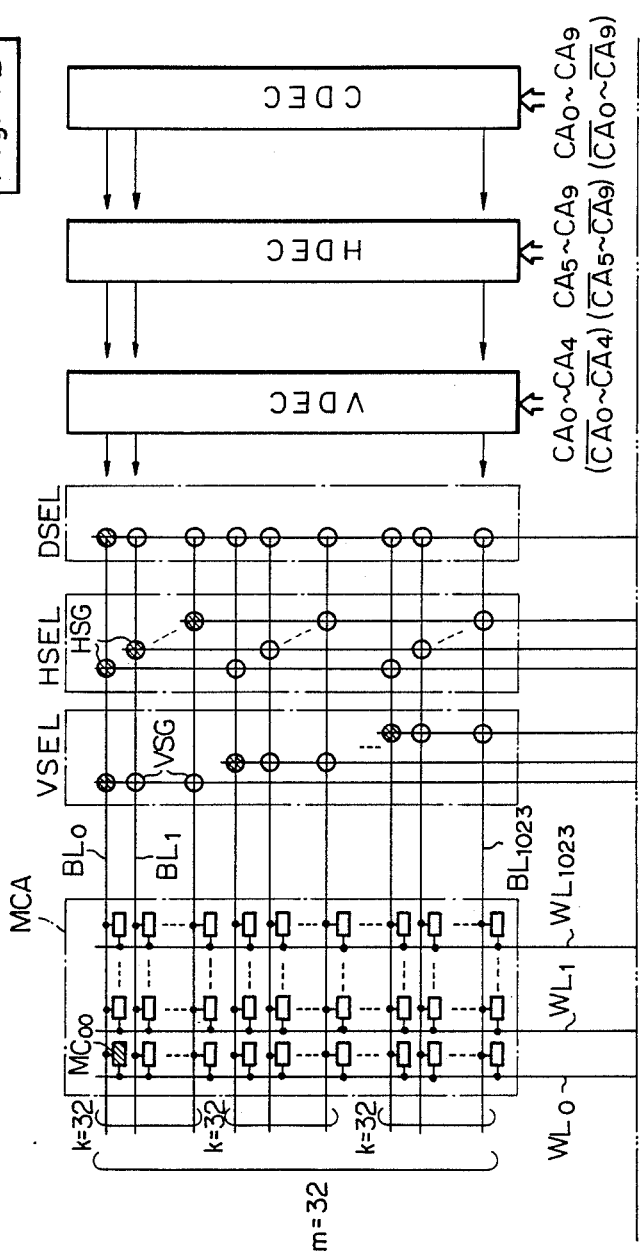
FIGS. 1A and 1B are a circuit diagram of a prior art semiconductor memory device incorporating an ECC circuit.
Figure 1B:
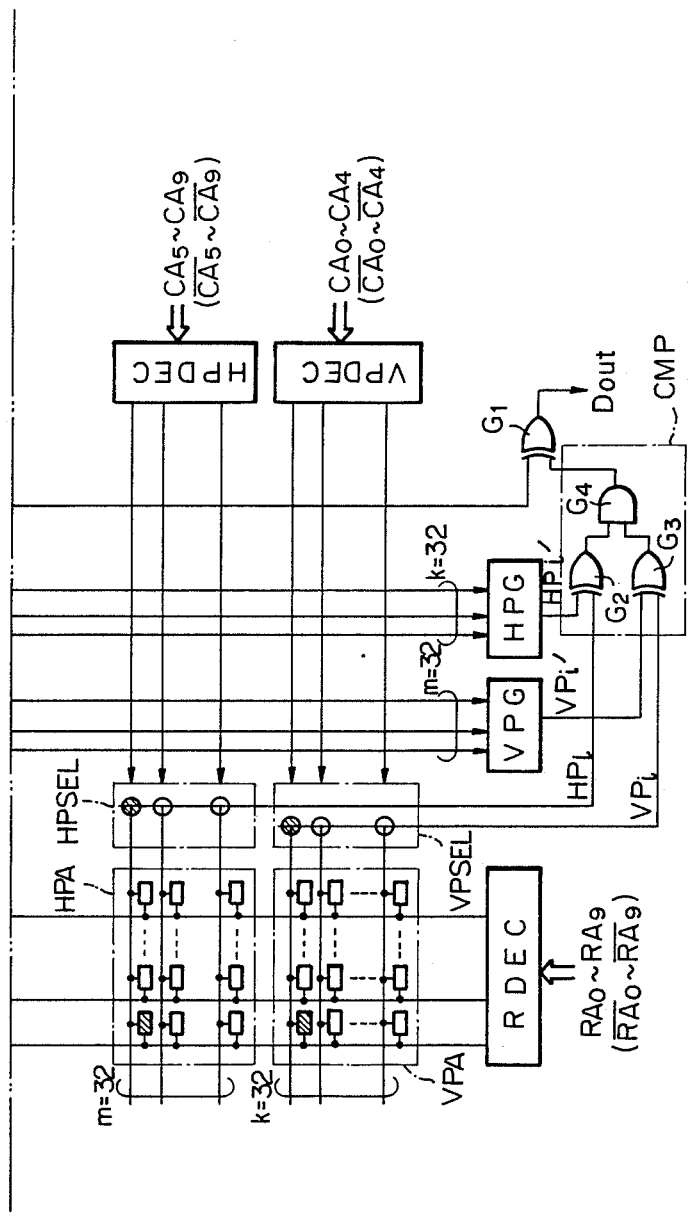

In FIG. 1, reference MCA designates a main memory cell array including 1 Mbit memory cells at intersections between word lines $WL_0, WL_1, \ldots,$ and $WL_{1023}$ and bit lines $BL_0, BL_1, \ldots, BL_{1023}$. The word lines $WL_0, WL_1, \ldots, WL_{1023}$ are selected by row address decoders RDEC, which receive row address signals $RA_0$ to $RA_9$ and their inverted signals $\overline{RA_0}$ to $\overline{RA_9}$ from the address buffers and the multiplexers (not shown). The bit lines $BL_0, BL_1, \ldots,$ and $BL_{1023}$ are selected by a data selector DSEL controlled by column address decoders CDEC, which receive column address signals $CA_0$ to $CA_9$ and their inverted signals $\overline{CA_0}$ to $\overline{CA_9}$ from address buffers and multiplexers (not shown). Thus, one memory cell such as $MC_{00}$ is accessed and data is read out via the data selector DSEL to an exclusive OR circuit $G_1$, which serves as an error correcting circuit, thereby obtaining output data $D_{out}$.

To carry out a horizontal and vertical parity checking operation upon the main memory cell array MCA, a horizontal selector HSEL, a vertical selector VSEL, a horizontal parity cell array HPA, a horizontal parity selector HPSEK, a vertical parity cell array VPA, a vertical parity selector VPSEL, a horizontal parity generator HPG, a vertical parity generator VPG, and a comparator circuit CMP are provided to form an ECC circuit. The horizontal and vertical selectors HSEL and VSEL are controlled by horizontal and vertical decoders HDEC and VDEC, respectively, and the horizontal and vertical parity selectors HPSEL and VPSEL are controlled by horizontal and vertical parity decoders HPDEC and VPDEC, respectively. Note that the decoders HPDEC and VPDEC are of the same type as the decoders HDEC and VDEC, respectively.

According to the above mentioned ECC circuit, the main memory cell array MCA is divided into a plurality of submemory cell arrays each of which is, for example, comprised of k×m memory cells connected to each word line. Simultaneously with the selection of one submemory cell array, i.e., one word line such as $WL_0$, data is read out of (k+m) memory cells by the horizontal and vertical selectors HSEL and VSEL. That is, the horizontal and vertical selectors HSEL and VSEL virtually (or logically) rearrange the data of all k×m memory cells connected to a selected word line into a parity-checking two-dimensional matrix (H-V matrix) with k bits in the horizontal (row) direction and m bits in the vertical (column) direction, as shown in FIG. 2.

Figure 2:
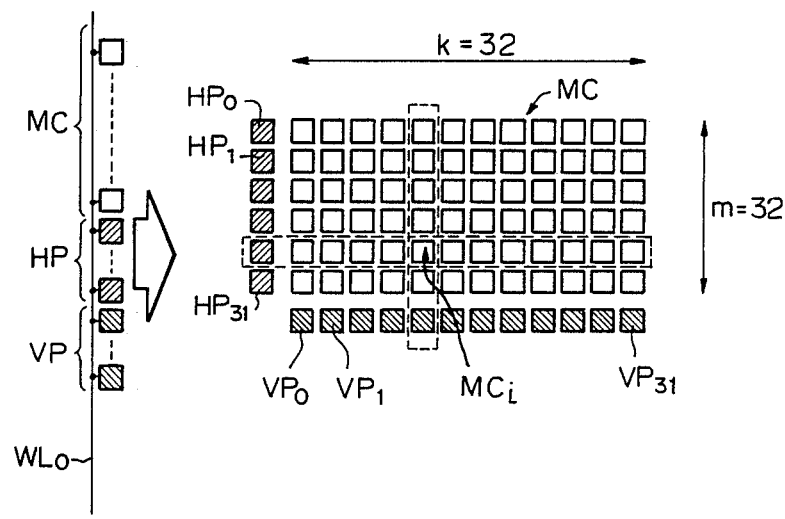
FIG. 2 is diagram of one two-dimensional virtual matrix configuration in FIG. 1.

In FIG. 2, horizontal parity bits $HP_0$ to $HP_{31}$ (for example, m=32) and vertical parity bits $VP_0$ to $VP_{31}$ (for example, k=32) are allocated to the rows and columns of a two-dimensional matrix formed by memory cells MC connected to one word line such as $WL_0$. Also, the horizontal parity bits $HP_0, HP_1, \ldots,$ and $HP_{31}$, and the vertical parity bits $VP_0, VP_1, \ldots,$ and $VP_{31}$ are arranged on the same word line $WL_0$ as indicated by HP and VP.

In the horizontal selector HSEL, reference HSG designates a horizontal selection gate for selecting k-bit data on a selected row of the H-V matrix including a selected memory cell $MC_i$. In the vertical selector VSEL, reference VSG designates a vertical selection gate for selecting m-bit data on a selected column of the H-V matrix including the selected memory cell $MC_i$ (i.e., see the dotted lines in FIG. 2).

The selected k-bit data from the horizontal selection gate HSG is supplied to the horizontal parity generator HPG, which generates a horizontal parity $HP_i'$ for the k-bit data. Simultaneously, the selected m-bit data from the vertical selection gate VSG is supplied to the vertical parity generator VPG, which generates a vertical parity $VP_i'$ for the m-bit data.

The horizontal and vertical parity cell arrays HPA and VPA consists of parity cells each storing correct horizontal and vertical parities, respectively. The correct parities have been previously written into the parity cells during a writing of data into all of the memory cells MC in the main memory cell array MCA.

The comparator circuit CMP consists of an exclusive OR circuit $G_2$ for comparing the horizontal parity $HP_i'$ from the horizontal parity generator HPG with the correct horizontal parity $HP_i$ from the horizontal parity cell array HPA, and an exclusive OR circuit $G_3$ for comparing the vertical parity $VP_i'$ from the vertical parity generator VPG with the correct vertical parity $VP_i$ from the vertical parity cell array VPA. The comparator circuit CMP further includes an AND circuit $G_4$ connected to the outputs of the exclusive OR circuits $G_2$ and $G_3$.

Therefore, when the horizontal parity comparison and the vertical parity comparison simultaneously represent the non-coincidence of the horizontal parity of the read data with the correct horizontal parity and the non-coincidence of the vertical parity of the read data with the correct vertical parity, the data read from the memory cell on the intersection of the selected horizontal row and the selected vertical column in the H-V matrix is not correct. As a result, a logic "1" is supplied to an input of the exclusive OR circuit $G_1$ which inverts the data read out of the H-V matrix. Otherwise, a logic "0" is supplied to the input of the exclusive OR circuit $G_1$, and the circuit $G_1$ passes the data read out of the H-V matrix therethrough without modification.

Note that the horizontal decoders HDEC as well as the horizontal parity decoders HPDEC receive the lower bits $CA_0$ to $CA_4$ ($\overline{CA_0}$ to $\overline{CA_4}$) of the column address signals $CA_0$ to $CA_9$ ($\overline{CA_0}$ to $\overline{CA_9}$) in the case where k=32, and the decoders VDEC as well as the vertical parity decoders VPDEC receive the upper bits $CA_5$ to $CA_9$ ($\overline{CA_5}$ to $\overline{CA_9}$) of the column address signals $CA_0$ to $CA_9$ ($\overline{CA_0}$ to $\overline{CA_9}$) in the case where m=32.

Also, in FIG. 1 if the memory cell $MC_{00}$ is accessed by the row decoders RDEC and the column decoders CDEC, the shaded elements shown on the word lines and bit lines are accessed or selected. In practice, each of the k signal lines and m signal lines from the horizontal selector HSEL and the vertical selector VSEL and the like shown in FIG. 1 has a pair of lines to produce differential outputs. However, these pairs of lines are denoted by one line for simplicity.

The error correction function of the above-described H-V matrix is effective not only for a soft error due to α rays but also for a hard error caused by a hard defect of a memory cell or for a bit line defect. However, there is a disadvantage in the above-described H-V matrix in that the error is correctable for only one bit in the memory cells belonging to a common horizontal or vertical parity group. That is, an error can be corrected only when a single bit in any H-V parity check data group in the above-mentioned H-V matrix is in error.

To correct a plurality of hard errors, a redundancy technique for remedying hard errors and for improving the yield is well known. In a redundancy configuration a row or column redundancy, i.e., a redundant word line or bit line, is provided to replace a defective word line or bit line. The conventional technique can be combined with the redundancy technique without difficulty. Hard defects along a predetermined defective word line or bit line can be remedied by the redundancy technique, and a soft error or a hard error caused after the determination of the defective word line or bit line can be realized by means of the two-dimensional parity checking using the above-mentioned H-V matrix. However, it is difficult to combine the configuration of a column (bit line) redundancy with the above-described two-dimensional parity checking technique. That is, when only the conventional row or column redundancy technique is used, the switching from the defective row or column to the redundant row or column can be accomplished by merely controlling the switching of the coupling to the data bus lines from the regular row or column (defective row or column) to the redundant row or column. However, to simply combine the two-dimensional parity checking technique with the row or column redundancy technique is too complex. That is, the logic of switching from the regular row or column (the memory cells connected to the selected word line or bit line), which must be expressed in a number of H-V matrixes, to the redundant row or column, becomes too complex. To effect the switching to the redundant row or column and to also effect the two-dimensional parity checking using the H-V matrix, a defective row or column data must be inhibited from mixing with a row-data or column-data group from which a parity is to be taken, and the defective row or column data must be replaced by the redundant row or column data. Since the location of the generation of the defective row or column is indefinite, the correspondence between the redundant row or column and the H-V matrix is difficult to establish without assembling a switching control circuit. Thus, a great number of circuit elements is necessary to realize this very complex logic.

Figure 3A:
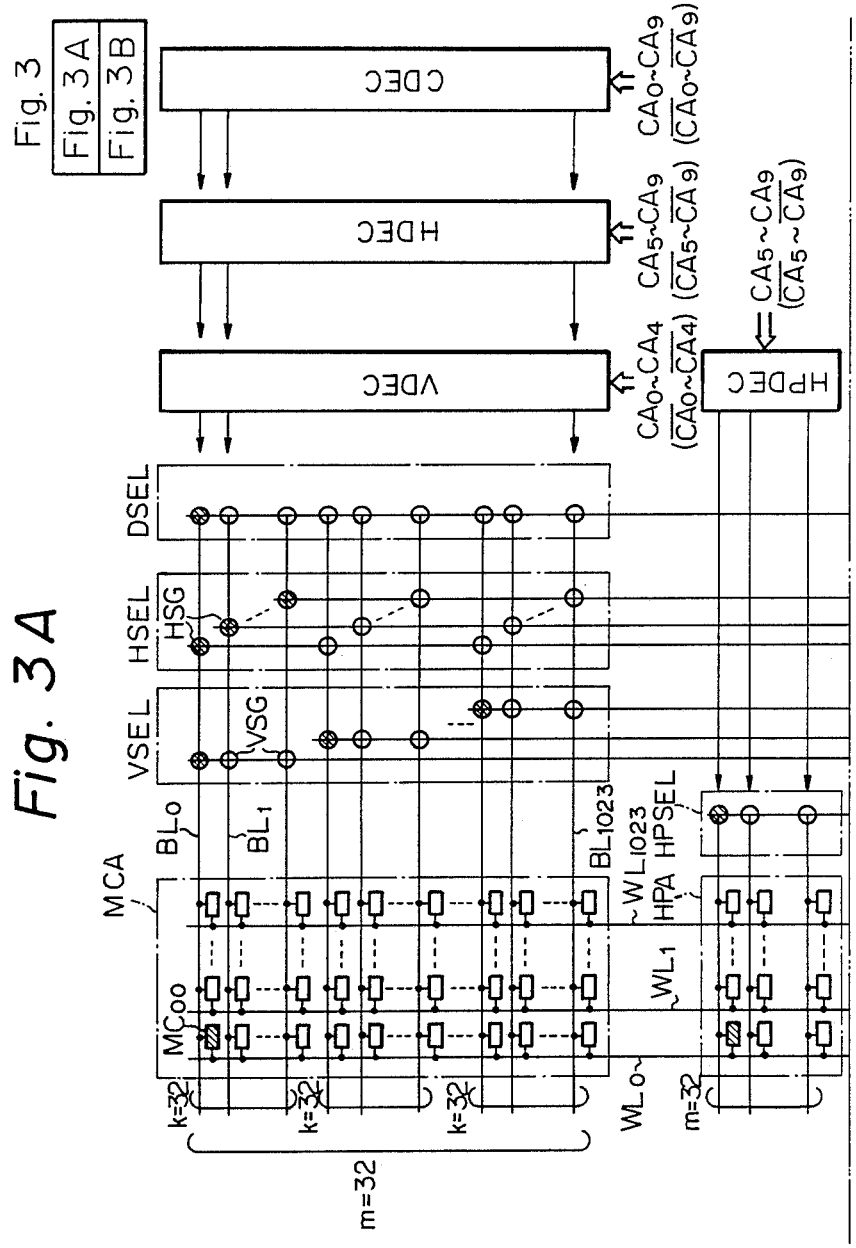
FIGS. 3A and 3B are a circuit diagram of a semiconductor memory device incorporating an ECC circuit and a redundancy configuration according to the present invention.
Figure 3B:
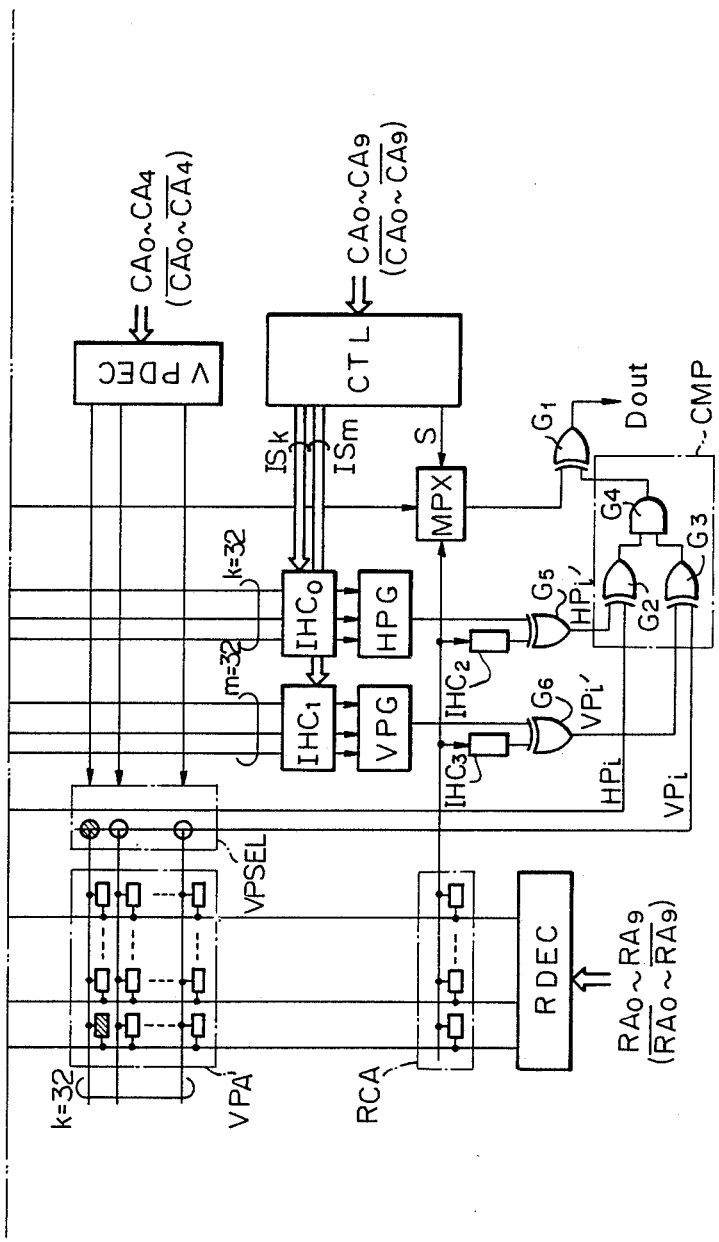

The inventor has, however, already proposed a semiconductor memory device which combines the two-dimensional parity checking technique with the redundancy technique, as illustrated in FIG. 3.

In FIG. 3, a redundancy column cell array RCA is provided for redundancy bits. Also provided are inhibit circuits $IHC_0$ to $IHC_3$, exclusive OR circuits $G_5$ and $G_6$, a multiplexer MPX, and an inhibit control circuit CTL are added to the elements of FIG. 1. The inhibit circuit $IC_0$ comprises switch circuits for receiving signals. That is, when a signal $IS_k$ ($k=0$ to 31) is H (high level) corresponding to a defective cell, the corresponding switch is shut off, so that data read from the defective cell is forcibly made "0", thereby removing the read data of the defective cell. The inhibit circuit $IC_1$ has the sme configuration as the inhibit circuit $IC_0$. Thus, the horizontal parity generator HPG and the vertical parity generator VPG perform a parity calculating operation upon k bits (row data) and m-bits (column data) except for the defective bit. The parity bits of the parity generators HPG and VPG are supplied to inputs of the exclusive OR circuits $G_5$ and $G_6$, respectively. On the other hand, the word lines $WL_0$, $WL_1$, ..., and $WL_{1023}$ are arranged not only on the memory cell array MCA, but also on the redundancy cell array RCA. Therefore, when one word line for the main memory cell array MCA is selected, one cell of the redundancy memory cell array RCA is also selected. If this redundancy cell is replaced with a defective cell, a signal $RAS_k$ and/or a signal $RAS_m$ is made L (low level). Thus, data of the redundancy cell passes through the inhibit circuit $IHC_2$ and/or $IHC_3$ and is supplied to an input of the exclusive OR circuit $G_5$ and/or $G_6$. Parity check operations are performed upon all of the cells of a row and a column including a selected cell, and as a result, in the exclusive OR circuits $G_2$ and $G_3$ of the comparator circuit CMP, the obtained parities $HP_i'$ and $VP_i'$ are compared with the correct parities $HP_i$ and $VP_i$ read out of the parity cell arrays HPA and VPA, respectively. If both of the parities $HP_i'$ and $VP_i'$ are erroneous, the output of the AND circuit $G_4$ is high, and accordingly, the data read out of the selected memory cell $MC_i$ of the H-V matrix (see FIG. 2) is reversed by the exclusive OR circuit $G_1$.

If there is no defective cell, the inhibit circuits $IHC_0$ and $IHC_1$ are in a through state, and the circuits $IHC_2$ and $IHC_3$ produce a low level signal, so that the exclusive OR circuits $G_5$ and $G_6$ are in a through state. The device of FIG. 3 in this state is the same as the device of FIG. 1. On the other hand, if there is a defective cell and this cell is included in a row or column of the above-mentioned H-V matrix including a selected cell, the defective cell is replaced with a redundancy cell of the redundancy memory cell array RCA by the inhibit circuits $IC_0$ to $IC_3$, and similar parity check operations to those in FIG. 1 are carried out. Thus, in FIG. 3, a bit hard error and a bit soft error can be detected and corrected.

The inhibit control circuit CTL comprises a read only memory (ROM) for storing an address of a defective cell, an inhibit signal generator circuit, and the like, and receives the column address signals $CA_0$ to $CA_9$ and their inverted signals $\overline{CA_0}$ to $\overline{CA_9}$ from the address buffers and the multiplexers (not shown) to produce the signals $IS_k$, $IS_m$, $RAS_k$, $RAS_m$, and S. The signals $IS_k$ and $IS_m$ are outputs of circuits for comparing a row component and a column component of a memory access address with a row address and a column address, respectively, indicating a defective cell. If one of the row address and the column address coincides with the memory access address, the corresponding circuit generates a high level. The signals $RAS_k$ and $RAS_m$ are obtained by the signals $IS_k$ and $IS_m$. For example, when the signals $IS_k$ and $IS_m$ are high, all of the signals $RAS_k$ and $RAS_m$ are low, so that the inhibit circuits $IHC_2$ and $IHC_3$ are in a through state. The inhibit control circuit CTL also generates the signal S for operating a multiplex MPX when a defective cell is accessed. As a result, read data is, in this case, obtained from the redundancy cell array RCA, not from the main memory cell array MCA.

In the device of FIG. 3, a soft error and a hard error, after a previous determination of hard error, are compensated. However, the switching elements for redundancy memory cells such as the inhibit control circuit CTL, the inhibit circuits, and the like are still complex and require a much larger space, thus reducing the manufacturing yield.

Figure 4B:
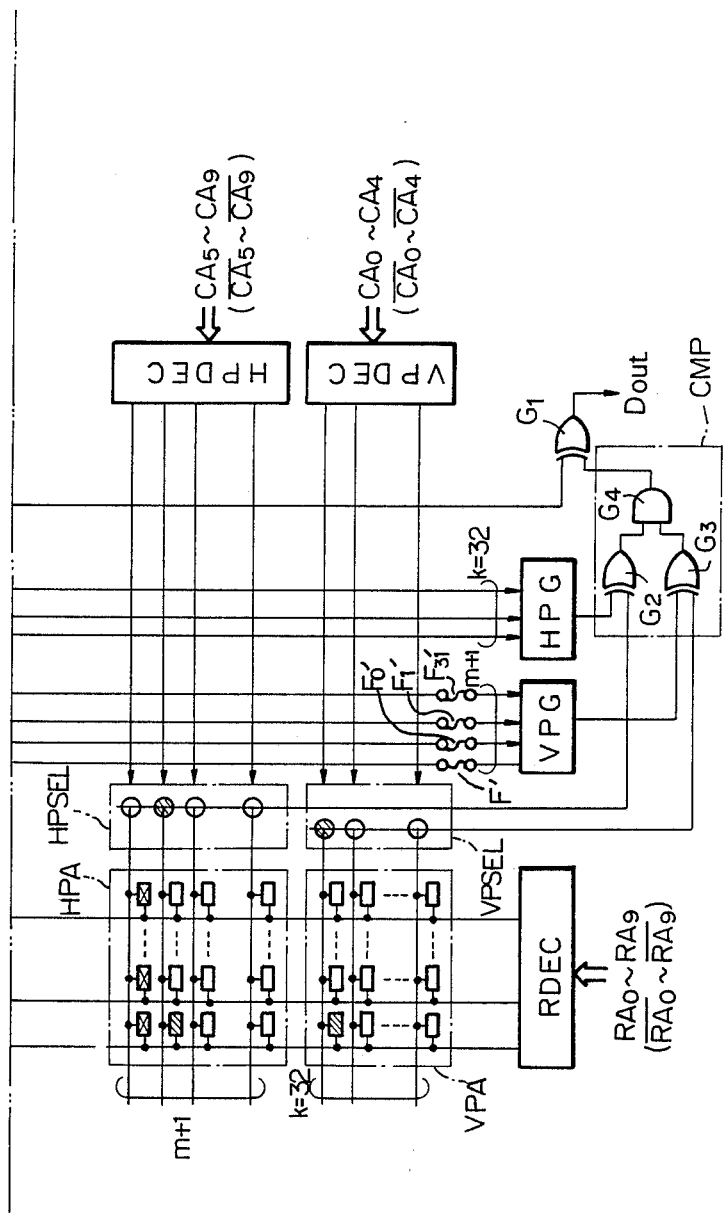

In FIG. 4, which is an embodiment according to the present invention, includes a redundancy memory cell array RCA', a redundancy horizontal selector RHSEL, a redundancy vertical selector RVSEL, a switch SW, and fuses F', $F_0'$, $F_1'$, ..., and $F_{31}'$ added to the elements of FIG. 1. The redundancy horizontal selector RHSEL, like the horizontal selector HSEL, is controlled by horizontal decoders HDEC', and the redundancy vertical selector VHSEL, like the vertical selector VSEL, is controlled by vertical decoders VDEC'. The switch SW which may be constructed by a pair of transistors, is controlled by the vertical decoders VDEC'. Further, the horizontal parity cell array HPA incorporates a redundancy horizontal parity cell array for the redundancy cell array RCA' as indicated by portions marked with a diagonal cross.

Figure 5:
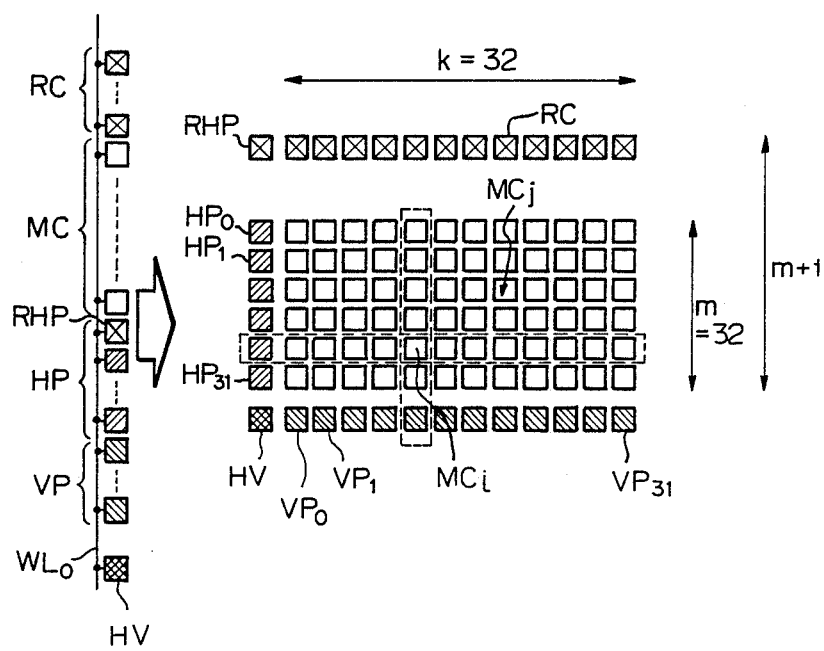
FIG. 5 is a diagram of one two-dimensional virtual matrix configuration in FIG. 4.

The redundancy memory cell array RCA' comprises a plurality of rows, each of which corresponds to one horizontal or vertical array of an H-V matrix configuration. That is, as illustrated in FIG. 5, a one bit redundancy cell is not provided for each word line, but a row or column of redundancy cells are provided for one row or one column of the H-V matrix prepared by the ECC circuit of a horizontal and vertical parity checking system. In FIG. 5, reference HV designates a parity corresponding to the horizontal parities $HP_0$, $HP_1$, ..., $HP_{31}$, and vertical parities $VP_0$, $VP_1$, ..., and $VP_{31}$. That is, the parities $HP_0$ to $HP_{31}$ and $VP_0$ to $VP_{31}$ are added, and an error detection of the horizontal and vertical parity bits can be carried out by the least significant bit of the sum, i.e., the odd parity or even parity thereof. A detailed explanation regarding the parity HV is, however, omitted.

Note that, in FIG. 5, redundancy cells RC connected to one word line such as $WL_0$ are provided as a horizontal (row) array for the H-V matrix, however, such redundancy cells RC can be provided as a vertical (column) array. Such a provision does not give rise to a problem.

If a memory cell $MC_j$ on the word line $WL_0$ is a hard error, the entire j-th row including this cell $MC_j$ is replaced with the redundancy cells RC. That is, the j-th row cells of this word line are simply replaced with the redundancy cells RC. As a result, the control for switching these cells is simple and easily performed.

Figure 6B:
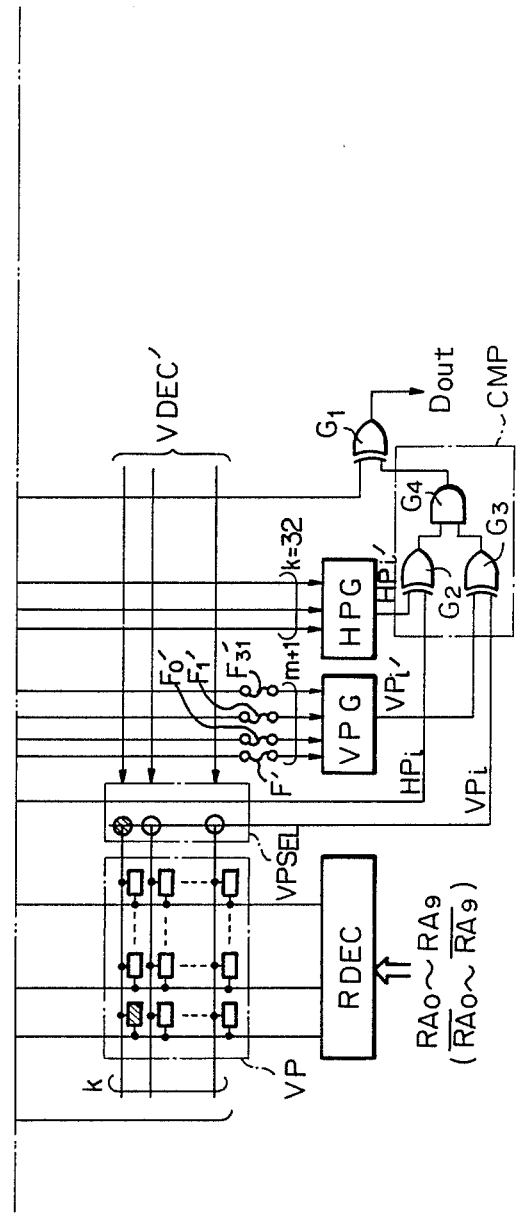

Also, in FIG. 4, the horizontal decoders HDEC' serve as the horizontal parity decoders HPDEC, and the vertical decoders VDEC' serve as the vertical parity decoders VPDEC. Therefore, the horizontal parity decoders HPDEC and the vertical parity decoders VPDEC can be deleted, and simultaneously, the cells of the horizontal parity cell array HPA can be incorporated into each row of each H-V matrix of the main memory cell array MCA and each row of the redundancy memory cell RCA', as shown in FIGS. 6 and 7.

Figure 7:
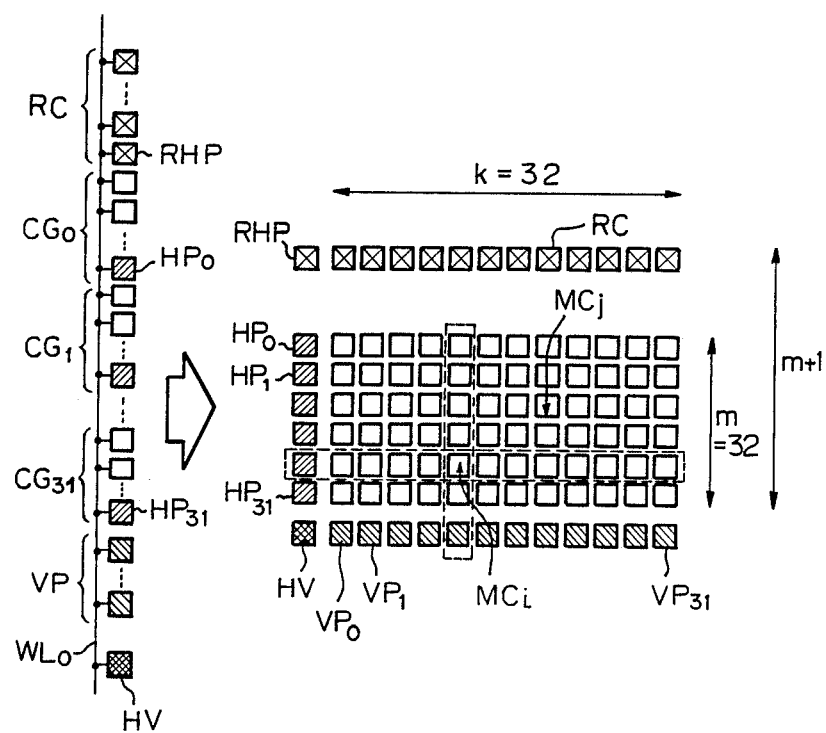
FIG. 7 is a diagram of one two-dimensional virtual matrix configuration in FIG. 6.

In FIG. 7, although the H-V matrix configuration is the same as that of FIG. 5, the arrangement of cells connected to one word line such as $WL_0$ is different from that of FIG. 5. That is, each column group $CG_0$ to $CG_{31}$ includes not only k memory cells, but also a redundancy horizontal parity $HP_0$ to $HP_{31}$. The row of the redundancy cells RC incorporates the horizontal parity RHP thereof.

If a hard error is detected, a row address and a column address are previously written into fuse-type ROMs of the horizontal decoders HDEC' and the vertical decoders VDEC', and the fuses F', $F_0'$, $F_1'$, ..., and $F_{31}'$. As a result, if a selected memory cell is a predetermined defective cell, such a selected memory cell is replaced with the corresponding redundancy memory cell within the redundancy cell array RCA'. Also, if a row of the H-V matrix including the predetermined defective cell is accessed by the ECC circuit, such a horizontal array (row) including the parity thereof is replaced with the corresponding row of the redundancy cell array RCA' including the parity thereof. Accordingly, the horizontal parity generator HPG performs a parity calculation upon the corresponding row of the redundancy cell array RCA'. Further, if a vertical array (column) of the H-V matrix including the predetermined defective cell is accessed by the ECC circuit, the predetermined defective cell is replaced with the corresponding bit of the redundancy cell array RCA'. Accordingly, the vertical parity generator VPG performs a parity calculation upon the vertical array (column) of the H-V matrix in which only the defective cell is replaced with the corresponding cell of the redundancy cell array RCA'. In this case, the switch SW is turned ON, while the corresponding fuse is previously blown. The post stages of the horizontal parity generator HPG and the vertical parity generator VPG are the same as those of FIG. 1.

The operation of the device of FIG. 6 will be explained in more detail with reference to FIGS. 8, 9, and 10.

Figure 8:
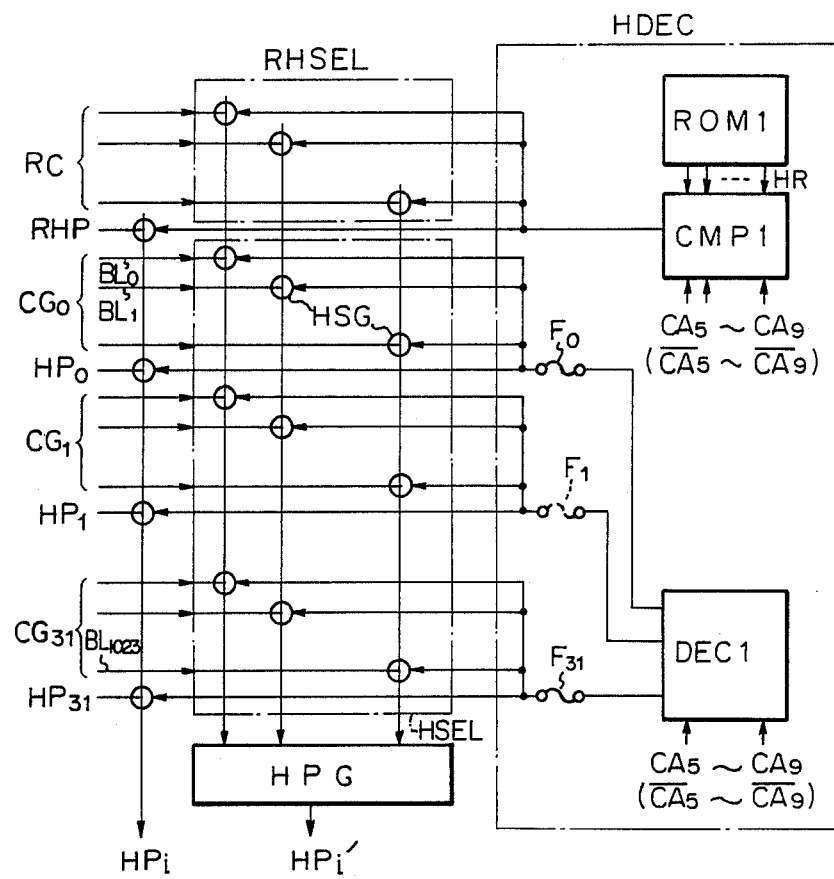
FIG. 8 is a circuit diagram of a portion of the ECC circuit in FIG. 6 necessary a horizontal parity check operation.

As shown in FIG. 8, the horizontal decoders HDEC comprise decoders DEC1 which receive an upper five bits $CA_5$ to $CA_9$ ($\overline{CA_5}$ to $\overline{CA_9}$) of the column address signals and select one of the column groups $CG_0$, $CG_1$, ..., and $CG_{31}$ via the horizontal selector HSEL, a ROM1 of a fuse type for storing a horizontal address (row address) HR of an H-V matrix corresponding to a defective memory cell, and a comparator CMP1 for comparing the upper five bits of the column address signals with the content of the ROM1. The horizontal decoders HDEC also comprise fuses $F_1$, $F_2$, ..., and $F_{31}$ corresponding to the column groups $CG_0$, $CG_1$, ..., and $CG_{31}$, respectively.

Figure 9:
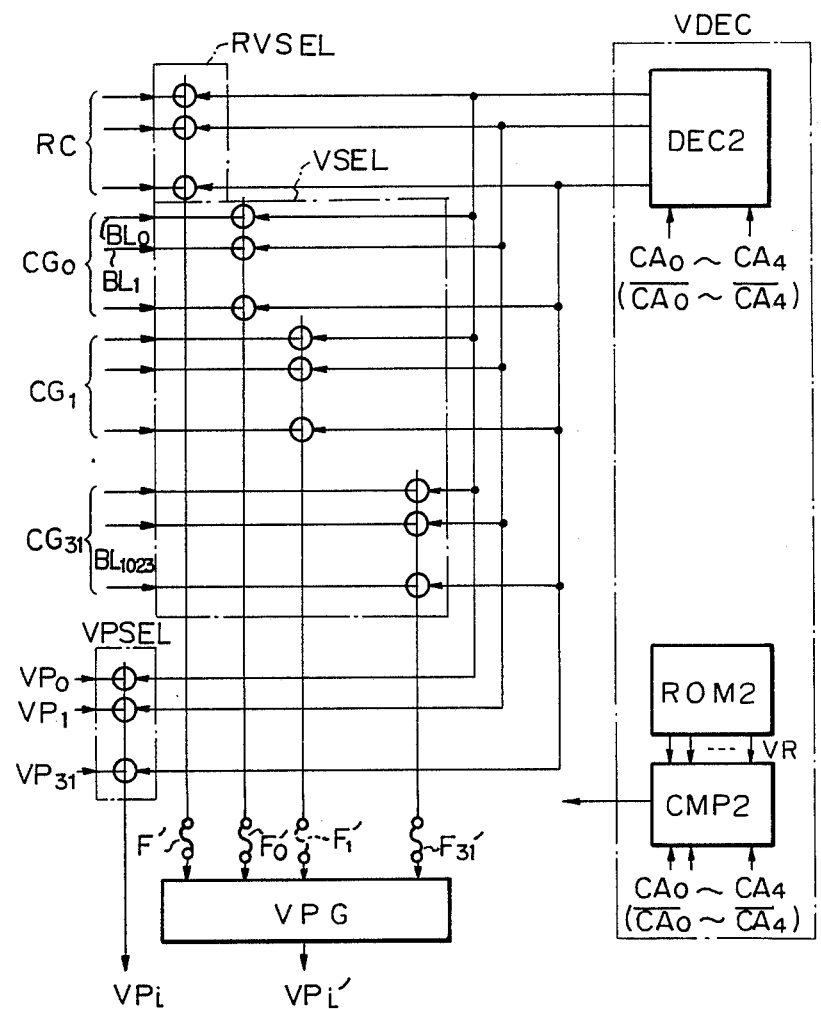
FIG. 9 is a circuit diagram of portion of the ECC circuit in FIG. 6 necessary a vertical parity check operation.
Figure 10:
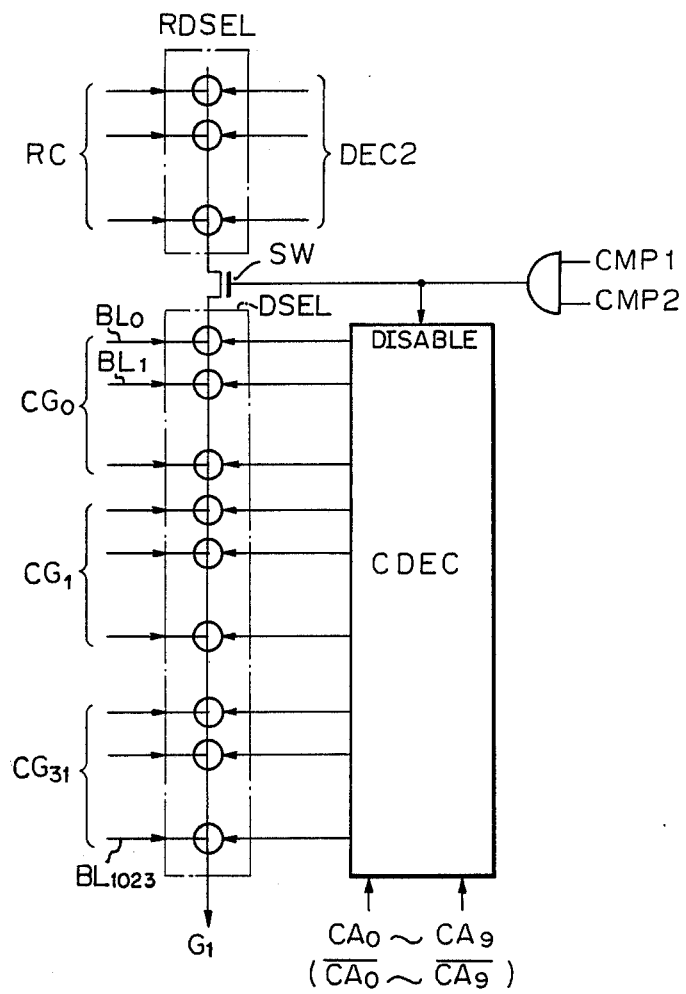
FIG. 10 is a circuit diagram of the data selector, the redundancy data selector, and the column decoders in FIG. 6.

Similarly, as shown in FIG. 9, the vertical decoders VDEC comprise decoders DEC2 which receive the lower five bits $CA_0$ to $CA_4$ ($\overline{CA_0}$ to $\overline{CA_4}$) of the column address signals and select one bit line of each of the column groups $CG_0$, $CG_1$, ..., and $CG_{31}$ via the vertical selector VSEL, a ROM2 of a fuse type for storing a vertical address (column address) VR of an H-V matrix corresponding to a defective memory cell, and a comparator CMP2 for comparing the lower five bits of the column address signals with the content of the ROM2.

Selection of a memory cell is conventionally carried out by the row decoders RDEC and the column decoders CDEC. That is, if a defective cell does not exist, one word line is selected by the row decoders RDEC, and one bit line, i.e., one selection gate of the data selector DSEL, is selected by the column decoders CDEC, thereby selecting a memory cell within the main memory cell array MCA. In this case, data is not written into the ROM1 of the horizontal decoders HDEC and the ROM2 of the vertical decoders VDEC, and the fuses $F_0$, $F_1$, ..., and $F_{31}$, $F_0'$, $F_1'$, ..., and $F_{31}'$ are unblown, but the fuse F' is blown.

Contrary to the above, if a defective cell (hard error) exists, a row address (horizontal address) HR and a column address (vertical address) VR of an H-V matrix for this defective cell are written into the fuse type ROM1 and ROM2 of the horizontal decoders HDEC and the vertical decoders VDEC, and in addition, into one of the fuses $F_0$, $F_1$, ..., and $F_{31}$ corresponding to the horizontal address HR and into one of the fuses $F_0'$, $F_1'$, ..., and $F_{31}'$ corresponding to the vertical address VR. Therefore, referring to FIG. 10, when a selective memory cell is a defective cell, both of the comparator circuits CMP1 and CMP2 generate a logic "1", so that the switch SW is turned ON, while the column decoders CDEC are disabled. In addition, the decoders DEC2 select one selection gate of the redundancy horizontal selector RHSEL. As a result, the selective memory cell is replaced with the corresponding redundancy cell within the redundancy cell array RCA'. Simultaneously, referring to FIG. 8, the decoders DEC1 select the blown fuse such as $F_2$, so that no column groups are selected, and instead, the comparator circuit CMP1 selects the redundancy cells RC via the redundancy horizontal selector RHSEL, so that the data read out of the redundancy cells RC is applied to the horizontal parity generator HPG. Further, referring to FIG. 9, although the decoders DEC2 always select one bit line of each column group and one bit line of the redundancy cell array RCA, the column group such as $CG_1$ connected to the blown fuse $F_1'$ is removed, and instead, the data of the redundancy cells RC is applied to the vertical parity generator VPG. Thus, data of a defective cell is replaced with data of the corresponding redundancy cell(s) for an H-V parity check.

Of course, even if a selected memory cell is not the predetermined defective cell, when a horizontal array (row) or a vertical array (column) of an H-V matrix includes the predetermined defective cell, this row or column is replaced with the corresponding row or column of the redundant cell array RCA for an H-V parity check.

Note that the operation of the device of FIG. 4 is the same as that of the device of FIG. 6.

As explained above, according to present invention, since a horizontal array (row) or a vertical array (column) of a matrix constructed by the H-V parity system is replaced by redundancy cells, the switching means becomes simple, thereby reducing the manufacturing costs.

I claim:

1. A semiconductor memory device comprising:
   a main memory cell array including a plurality of rows of main memory cells and a plurality of columns of main memory cells;
   a redundancy memory cell array including a plurality of rows of redundancy memory cells;
   first selector means, operatively connected to said main memory cell array and said redundancy memory cell array, for selecting a main memory cell in said main memory cell array, and for replacing one of said main memory cells in said main memory cell array with a corresponding one of said redundancy memory cells in said redundancy memory cell array when said one of said main memory cells in said main memory array is a predetermined defective cell; and
   an error checking and correcting circuit, operatively connected to said first selector means, for correcting data from said first selector means and including:
      second selector means, operatively connected to said main memory cell array and said redundancy memory cell array, for selecting a horizontal group of said main memory cells and a vertical group of said main memory cells including said main memory cell selected by said first selector means, and replacing said horizontal group or said vertical group of said main memory cells with a corresponding row of said redundancy memory cell array when said horizontal group or said vertical group of said main memory cells includes said predetermined defective cell;
      a horizontal parity generator, operatively connected to said second selector means, for generating a horizontal parity from data in said horizontal group of said main memory cells;
      a vertical parity generator, operatively connected to said second selector means, for generating a vertical parity from data in said vertical group of said main memory cells;
      parity storing means, for storing predetermined horizontal parities and predetermined vertical parities;
      a comparator circuit, operatively connected to said horizontal and vertical parity generators and to said parity storing means, for comparing said horizontal and vertical parities with corresponding ones of said predetermined horizontal and vertical parities, respectively, and outputting a signal; and
      a correction circuit, operatively connected to said first selector means and said comparator, for correcting data of said first selector means in accordance with the output signal of said comparator circuit.

2. A device as set forth in claim 1, wherein said parity storing means comprises:
   a horizontal parity cell array, operatively connected to said main memory cell array, including a plurality of rows of parity cells, each row provided for one row of said main memory cell array; and
   a vertical parity cell array, operatively connected to said memory cell array, including a plurality of rows of parity cells, each row provided for one row of said main memory cell array.

3. A device as set forth in claim 1, wherein said second selector means comprises:
   a horizontal selector, operatively connected to said main memory cell array, for selecting said horizontal group of main memory cells from each row of said main memory cell array;
   a redundancy horizontal selector, operatively connected to said redundancy memory cell array, for selecting one row of said redundancy memory cell array;
   first switching means, operatively connected to said horizontal selector and said redundancy horizontal selector, for replacing one of said horizontal group of main memory cells with said selected row of said redundancy memory cell array;
   a vertical selector, operatively connected to said main memory cell array, for selecting said vertical group of main memory cells from each row of said main memory cell array;
   a redundancy vertical selector, operatively connected to said redundancy memory cell array, for selecting a redundancy memory cell from one column of said redundancy memory cell array; and
   second switching means, operatively connected to said vertical selector and said redundancy vertical selector, for replacing one of said vertical group of main memory cells with said redundancy cell when said vertical group, of main memory cells includes said predetermined defective cell.

4. A semiconductor memory device comprising:
   a main memory cell array including:
      a plurality of rows of main memory cells;

a plurality of columns of main memory cells intersecting said plurality of rows of main memory cells; and a horizontal parity cell array including a plurality of rows of parity cells, each row provided for one row of said main memory cell array;

a redundancy memory cell array including a plurality of rows of redundancy memory cells;

first selector means, operatively connected to said main memory cell array and said redundancy memory cell array, for selecting a main memory cell in said main memory cell array, and for replacing one of said main memory cells in said main memory cell array with a corresponding one of said redundancy memory cells in said redundancy memory cell array when said one of said main memory cells in said main memory cell array is a predetermined defective cell; and an error checking and correcting circuit, operatively connected to said first selector means, for correcting data from said first selector means and including:

second selector means, operatively connected to said main memory cell array and said redundancy memory cell array, for selecting a horizontal group of said main memory cells and a vertical group of said main memory cells including said main memory cell selected by said first selector means, and replacing said horizontal group or said vertical group of said main memory cells with a corresponding row of said redundancy memory cell array when said horizontal group or said vertical group of said main memory cells includes a predetermined defective cell;

a horizontal parity generator, operatively connected to said second selector means, for generating a horizontal parity from data in said horizontal group of said main memory cells;

a vertical parity generator, operatively connected to said second selector means, for generating a vertical parity from data in said vertical group of said main memory cells;

parity storing means, for storing predetermined horizontal parities and predetermined vertical parities;

a comparator circuit, operatively connected to said horizontal and vertical parity generators and to said parity storing means, for comparing said horizontal and vertical parities with corresponding ones of said predetermined horizontal and vertical parities, respectively, and outputting a signal; and a correction circuit, operatively connected to said first selector means and said comparator, for correcting data of said first selector means in accordance with the output signal of said comparator circuit.

* * * * *

UNITED STATES PATENT AND TRADEMARK OFFICE
CERTIFICATE OF CORRECTION

PATENT NO.   : 4,768,193
DATED        : AUGUST 30, 1988
INVENTOR(S)  : YOSHIHIRO TAKEMAE

It is certified that error appears in the above-identified patent and that said Letters Patent is hereby corrected as shown below:

Col. 2, line 61, after "necessary" insert --for--;
      line 63, after "necessary" insert --for--.

Col. 5, line 58, "sme" should be --same--.

Col. 9, line 31, after "to" insert --the--.

Signed and Sealed this

Fourth Day of April, 1989

Attest:

DONALD J. QUIGG

Attesting Officer

Commissioner of Patents and Trademarks